(12) United States Patent
Mahler et al.

(10) Patent No.: US 10,177,112 B2
(45) Date of Patent: Jan. 8, 2019

(54) ATTACHING CHIP ATTACH MEDIUM TO ALREADY ENCAPSULATED ELECTRONIC CHIP

(71) Applicant: Infineon Technologies AG, Neubiberg (DE)

(72) Inventors: Joachim Mahler, Regensburg (DE); Edward Fuergut, Dasing (DE); Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 15/422,674

(22) Filed: Feb. 2, 2017

(65) Prior Publication Data

US 2017/0221857 A1     Aug. 3, 2017

(30) Foreign Application Priority Data

Feb. 3, 2016  (DE) .................. 10 2016 101 887

(51) Int. Cl.
| | |
|---|---|
| *H01L 23/495* | (2006.01) |
| *H01L 23/00* | (2006.01) |
| *H01L 21/48* | (2006.01) |
| *H01L 21/56* | (2006.01) |
| *H01L 21/78* | (2006.01) |
| *H01L 23/31* | (2006.01) |
| *H01L 23/498* | (2006.01) |

(52) U.S. Cl.
CPC .......... *H01L 24/96* (2013.01); *H01L 21/4825* (2013.01); *H01L 21/4853* (2013.01); *H01L 21/561* (2013.01); *H01L 21/78* (2013.01); *H01L 23/3157* (2013.01); *H01L 23/49562* (2013.01); *H01L 23/49844* (2013.01); *H01L 24/27* (2013.01); *H01L 24/32* (2013.01); *H01L 24/48* (2013.01); *H01L 24/73* (2013.01); *H01L 24/97* (2013.01); *H01L 21/568* (2013.01); *H01L 2224/04042* (2013.01); *H01L 2224/04105* (2013.01); *H01L 2224/3224* (2013.01); *H01L 2224/3226* (2013.01); *H01L 2224/32225* (2013.01); *H01L 2224/32245* (2013.01); *H01L 2224/48225* (2013.01); *H01L 2224/48245* (2013.01); *H01L 2224/73265* (2013.01); *H01L 2224/73267* (2013.01); *H01L 2224/9222* (2013.01); *H01L 2224/97* (2013.01); *H01L 2924/00014* (2013.01)

(58) Field of Classification Search
USPC ............ 257/100, 433, 667, 797–796, 257/E31.117–E31.118, E51.02, 257/E23.116–E23.14, 678–733, 787–796, 257/E23.001–E23.194, E21.499–E21.519; 438/15, 26, 51, 55, 64, 106, 124–127
See application file for complete search history.

(56) References Cited

U.S. PATENT DOCUMENTS

| | | | |
|---|---|---|---|
| 8,786,111 B2 * | 7/2014 | Fuergut | ............... H01L 23/3107 257/790 |
| 9,219,030 B2 * | 12/2015 | Yu | ......................... H01L 23/498 |

(Continued)

*Primary Examiner* — Tram H Nguyen

(57) ABSTRACT

A method of manufacturing a package which comprises encapsulating at least part of an electronic chip by an encapsulant, subsequently covering a part of the electronic chip with a chip attach medium, and attaching the encapsulated electronic chip on a chip carrier via the chip attach medium.

16 Claims, 6 Drawing Sheets

(56) References Cited

U.S. PATENT DOCUMENTS

| | | | |
|---|---|---|---|
| 2005/0008832 A1* | 1/2005 | Santos | C09J 5/06 428/209 |
| 2009/0091022 A1* | 4/2009 | Meyer | H01L 21/561 257/723 |
| 2010/0096734 A1* | 4/2010 | Abbott | H01L 21/568 257/666 |
| 2012/0040499 A1* | 2/2012 | Nomura | C08G 59/621 438/124 |
| 2013/0295720 A1 | 11/2013 | Fuergut et al. | |
| 2013/0299848 A1 | 11/2013 | Fuergut et al. | |
| 2014/0061878 A1 | 3/2014 | Mahler et al. | |

* cited by examiner

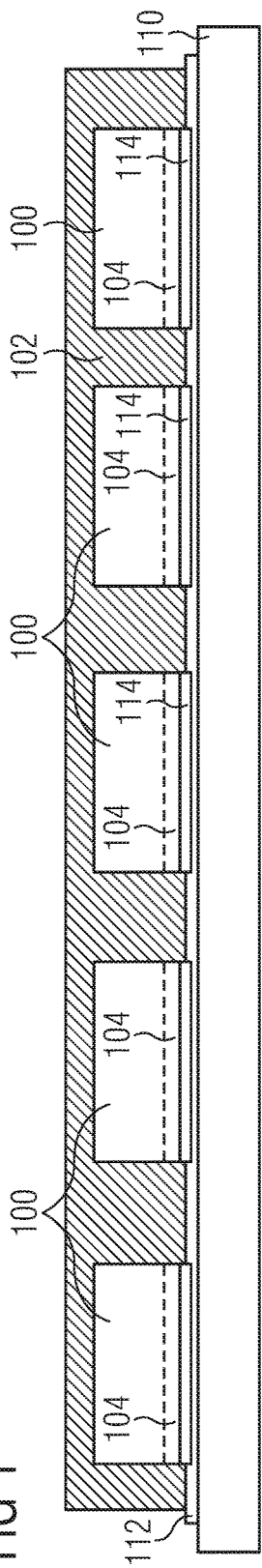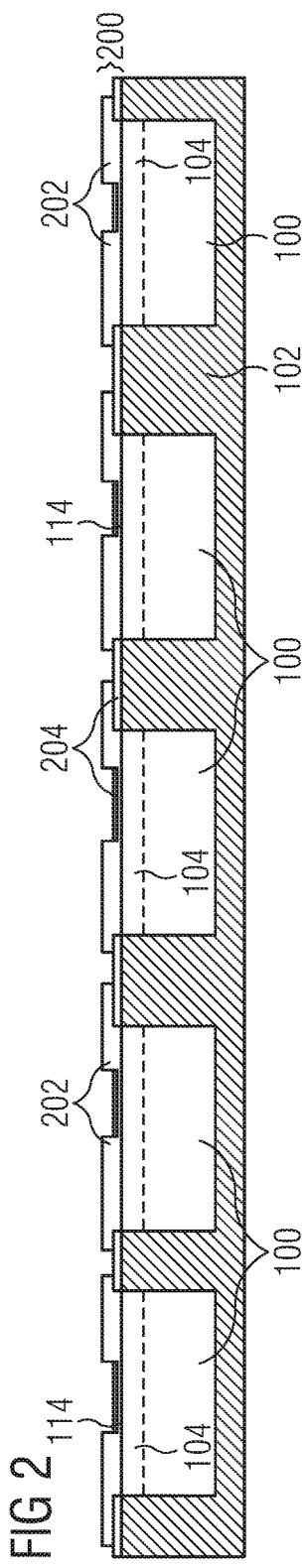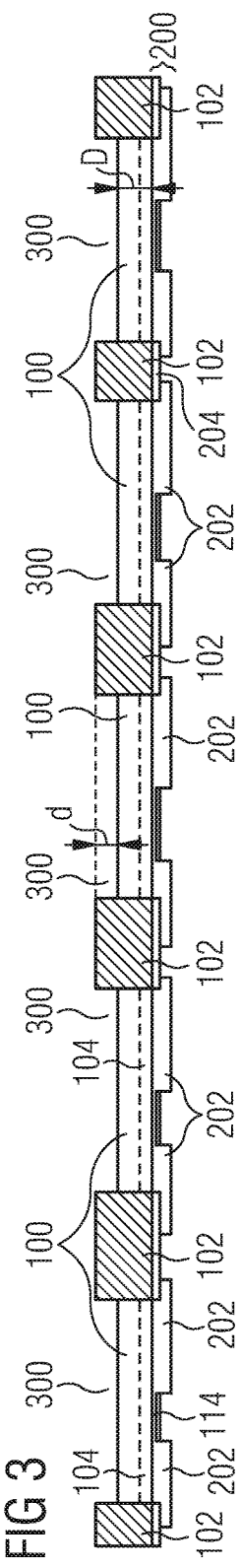

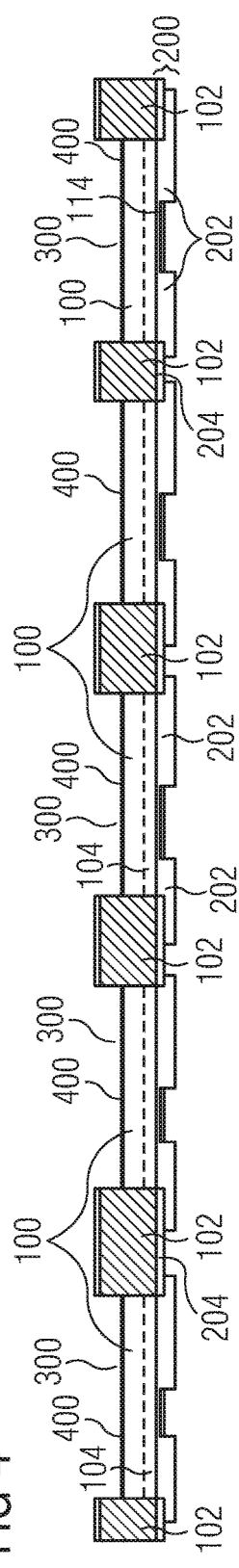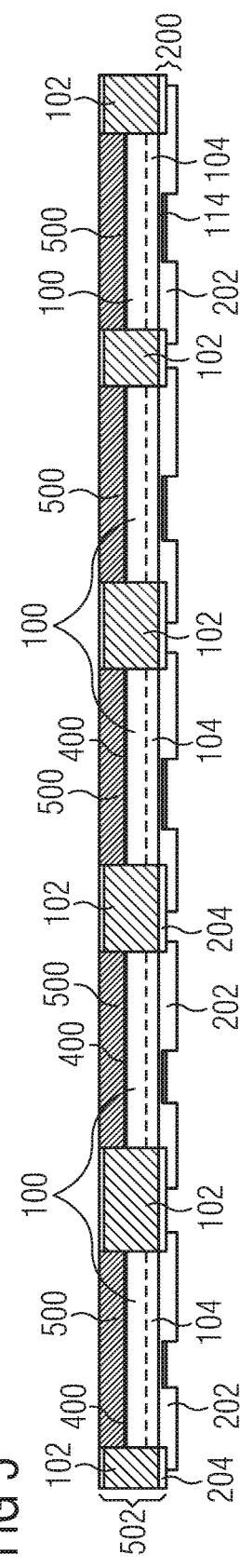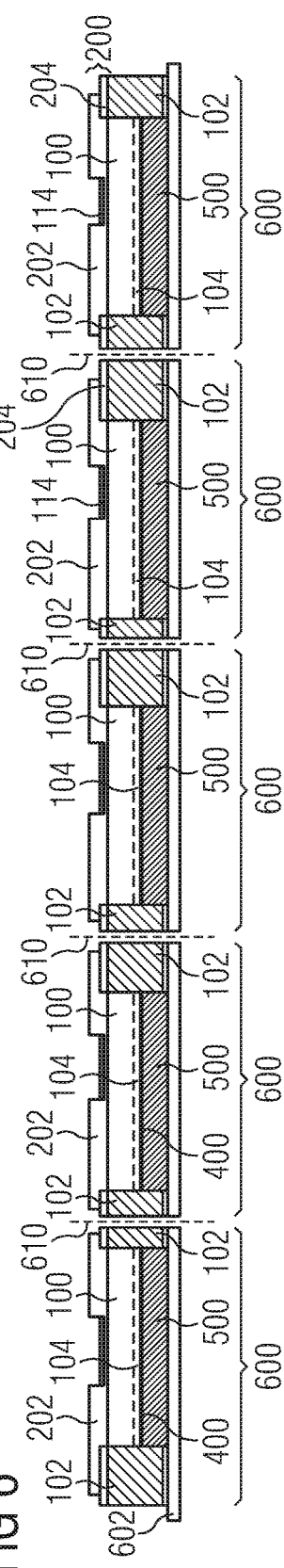

ATTACHING CHIP ATTACH MEDIUM TO ALREADY ENCAPSULATED ELECTRONIC CHIP

BACKGROUND OF THE INVENTION

Field of the Invention

The present invention relates to a method of manufacturing a package, a package, and a multi-package preform.

Description of the Related Art

Packages may be denoted as encapsulated electronic chips with electrical connects extending out of the encapsulant and being mounted to an electronic periphery, for instance on a printed circuit board. Packaging cost is an important driver for the industry. Related with this are performance, dimensions and reliability. The different packaging solutions are manifold and have to address the needs of the application. There are applications, where high performance is required, others, where reliability is the top priority—but all requires lowest possible cost.

US 2013/299848 A1 discloses a semiconductor package which includes a vertical semiconductor chip having a first major surface on one side of the vertical semiconductor chip and a second major surface on an opposite side of the vertical semiconductor chip. The first major surface includes a first contact region and the second major surface includes a second contact region. The vertical semiconductor chip is configured to regulate flow of current from the first contact region to the second contact region along a current flow direction. A back side conductor is disposed at the second contact region of the second major surface. The semiconductor package further includes a first encapsulant in which the vertical semiconductor chip and the back side conductor are disposed.

SUMMARY OF THE INVENTION

There may be a need to provide a possibility of reliably manufacturing packages without the risk of contamination or deterioration of an electronic chip during manufacturing. According to an exemplary embodiment, a method of manufacturing a package is provided, wherein the method comprises encapsulating at least part of an electronic chip by an encapsulant, subsequently covering a part of the electronic chip with a chip attach medium, and attaching the encapsulated electronic chip on a chip carrier via the chip attach medium.

According to another exemplary embodiment, a package is provided which comprises an electronic chip, an encapsulant encapsulating part of the electronic chip so that a cavity is delimited between the surface of the electronic chip and a surface of the encapsulant, and a chip attach medium in the cavity.

According to yet another exemplary embodiment, a multi-package preform is provided which comprises a plurality of electronic chips, an encapsulant encapsulating part of the electronic chips, and a chip attach layer on a surface of the plurality of electronic chips and on surface portions of the encapsulant between the electronic chips.

According to an exemplary embodiment of the invention, a packaged electronic chip is provided which is connected or to be connected to a chip carrier via a chip attach medium which may be applied on a partial chip surface only after encapsulation. Hence, it can be prevented that chip attach medium undesirably and unintentionally flows to a chip surface which shall remain free of the chip attach medium, since such a chip surface is already encapsulated when covering a desired surface portion of the chip with the chip attach medium. This prevents other chip surfaces, such as an active surface, from contamination or even damage (for example by an undesired electric short-circuiting by chip attach medium) due to chip attach medium flowing into undesired surface portions.

According to another exemplary embodiment of the invention, an undesired flow of chip attach medium into other surface portions of the electronic chip may be efficiently suppressed by applying the chip attach medium used for chip carrier connection of a specific electronic chip selectively (i.e. exclusively or also) into a cavity formed or delimited between encapsulant and electronic chip.

According to yet another exemplary embodiment of the invention, an efficient manufacturing of a plurality of packages is enabled without the risk of contamination or damage of the electronic chips due to an undefined flow of chip attach medium into forbidden regions. This is accomplished by forming a chip attach layer of chip attach medium on a surface of a preform of multiple packages after encapsulation of multiple electronic chips with an encapsulant. In such an embodiment, the chip attach medium may be located on the exposed surface portions of the electronic chips (for mounting the respective electronic chip on the chip carrier) as well as on exposed surface portions of the encapsulant in between (for mounting the respective portion of the encapsulant on the chip carrier).

DESCRIPTION OF FURTHER EXEMPLARY EMBODIMENTS

In the following, further exemplary embodiments of the method, the package, and the multi-package preform will be explained.

In the context of the present application, the term "chip attach medium" or "die attach medium" may particularly denote any medium which is capable of mechanically connecting an electronic chip with a chip carrier. Such a chip attach medium may have the consistency of a paste, a liquid, a gel, etc. A chip attach medium may be electrically conductive or electrically insulating. Examples for a chip attach medium are solder paste, adhesive paste, nanopaste, etc. For example, a chip attach medium may be applied by dispensing, by printing, in particular by screen printing.

In the context of the present application, the term "electronic chip" may particularly denote a naked die, i.e. a non-packaged (for instance non-molded) chip made of a processed semiconductor, for instance a singulated piece of a semiconductor wafer. A semiconductor chip may however also be an already packaged (for instance molded) die. One or more integrated circuit elements (such as a diode, a transistor, etc.) may be formed within the semiconductor chip. Such a semiconductor chip may be equipped with a metallization, in particular with one or more pads.

In the context of the present application, the term "chip carrier" may particularly denote a physical structure capable of carrying, and in particular also electrically connecting, an electronic chip, in particular forming part of a readily manufactured package. Example for such a chip carrier are a leadframe or a printed circuit board.

In an embodiment, the package is configured as a submodule for integration into a final module or system module, which may be larger than the submodule.

In an embodiment, the package comprises one electronic chip. However, in another embodiment, a plurality of electronic chips may be included in one package.

In an embodiment, the electronic chip has a thickness in a range between 5 μm and 150 μm, in particular between 20 μm and 60 μm. Semiconductor chips of such a small thickness are prone to be damaged when being handled as such. Furthermore, in view of the small vertical extension of such an electronic chip, such electronic chips are specifically prone to undesired up-flow of chip attach medium from one of the main surfaces of the electronic chip to an opposing another main surface of the electronic chip (where the active chip surface may be located). Early (in the process flow) encapsulation of the electronic chips therefore not only suppresses or even eliminates contamination and/or damage, but also simplifies handling of the tiny chips. This holds in particular for a batch manufacture, in which multiple electronic chips are encapsulated to thereby reconstitute an artificial wafer held together by encapsulant material, on which the chip attach medium can thereafter be applied.

In an embodiment, the encapsulant encapsulates part of the electronic chip so that a for instance substantially cup-shaped cavity is delimited between a surface of the electronic chip and a surface of the encapsulant, wherein the chip attach medium is located in the cavity, in particular exclusively in the cavity. Such a cavity may be a hole or space delimited by a bottom wall (defined by a surface of the electronic chip) and by sidewalls (defined by a surface of the encapsulant). The presence of a cavity promotes correct application of chip attach medium only onto desired surface portions and prevents a flow of uncured chip attach medium into undesired surface portions.

In an embodiment, the method further comprises thinning the electronic chip, in particular after the encapsulating. Thinning may be performed for forming the cavity delimited between a surface of the electronic chip and a surface of the encapsulant. Thinning of the encapsulated chip increases compactness of the package. Formation of a cavity can be accomplished by selective etching of material of the electronic chip with regard to the material of the encapsulant.

In an embodiment, the method further comprises removing part of the encapsulant before the thinning, in particular for exposing a surface of the electronic chip. Taking this measure further increases compactness of the manufactured package and provides the basis (by exposing previously encapsulated semiconductor material) for a subsequent thinning of the electronic chip and the formation of a cavity for accommodating the chip attach medium.

In an embodiment, the method further comprises encapsulating at least part of at least one further electronic chip by the same encapsulant already encapsulating the electronic chip, subsequently covering a part of the at least one further electronic chip with the chip attach medium, and attaching the encapsulated at least one further electronic chip on the chip carrier via the chip attach medium. Thus, the above described manufacturing procedure is compatible with a batch manufacture of a plurality of packages at the same time.

In an embodiment, the method further comprises separating an obtained structure into a plurality of packages each comprising at least one of the electronic chips, part of the encapsulant, part of the chip attach medium, and part of the chip carrier. Hence, a corresponding preform of multiple packages can then be separated into the individual packages by singularization, for instance by sawing or etching. Singularization may be performed before or after attaching the chip carrier to the encapsulated chip via the previously applied chip attach medium.

In an embodiment, the electronic chip and the at least one further electronic chip are sections of a common semiconductor wafer with thinned semiconductor webs in between. In particular the webs may be constituted by semiconductor material of the wafer bridging and being thinner than semiconductor material of adjacent electronic chips. The electronic chips may be separated from one another after the encapsulating by removing the webs. Thinning encapsulant and/or electronic chips on the one hand and singularization on the other hand may therefore be accomplished by a single common procedure and hence very efficiently.

In an embodiment, the electronic chip comprises a first main surface facing the chip attach medium and an opposing second main surface comprising an active region of the electronic chip. The term "active region" may denote a surface semiconductor portion of the electronic chip in which one or more integrated circuit elements are formed, such as transistors, diodes, etc. A surface metallization may be provided as one or more chip pads on the active region.

In an embodiment, the method further comprises curing the chip attach medium after the attaching, in particular by at least one of increasing temperature and increasing pressure. By such a curing procedure, an adhesion between chip carrier and the electronic chip by the chip attach medium may be triggered.

In an embodiment, the method comprises growing, in particular galvanically growing, the chip carrier on the chip attach medium. For such an embodiment, it is advantageous that an electrically conductive chip attach medium is used which is connected with a voltage or current source during the galvanic deposition. Galvanically growing a chip carrier on an encapsulated chip with attached chip attach medium allows for a very simple and efficient packaging procedure.

In an embodiment, the method comprises forming the cavity by arranging the electronic chip on a dummy body prior to the encapsulating and removing the dummy body after the encapsulating. For example, such a dummy body or sacrificial body may serve as a mechanically stable support on which the tiny electronic chip may be mounted for encapsulation for simplifying handling of the electronic chip. After encapsulation, the dummy body may be removed, for instance by detaching or selective etching, to thereby form a cavity at the previous position of the dummy body for subsequently accommodating a chip attach medium. For example, such a dummy body may be a glass substrate.

In an embodiment, the encapsulant is only partially (or even not all) cured upon encapsulating, and is completely cured upon or after attaching the encapsulated electronic chip on a chip carrier. This has the advantage that the material of the encapsulant itself contributes to the connection between the encapsulant and the chip carrier which renders the provision of chip attach medium between encapsulant and chip carrier dispensable.

In an embodiment, the package comprises a chip carrier on which the encapsulated electronic chip is attached via the chip attach medium. Such a chip carrier may be, for example, a leadframe or a printed circuit board. The electronic chip and the chip carrier may not only be connected mechanically to one another, but also coupled electrically.

In an embodiment, the electronic chip has a first main surface facing the chip attach medium and has an opposing second main surface facing a redistribution layer of the package. A patterned electrically conductive structure, embedded in a dielectric medium, may hence serve as a redistribution layer and may translate signals between the tiny dimensions of pads of the electronic chip and the larger dimensions of external electric contacts of a PCB or the like. In other words, the small dimensions of the chip world are transferred by the redistribution layer into the larger dimensions of the world of a mounting base such as printed circuit boards on which the electronic component or package may be mounted.

In an embodiment, the electronic chip has a backside metallization at the first main surface and has an active region at the second main surface. Such a backside metallization may be advantageous when the electronic chip experiences a vertical current flow, as appropriate for instance for power semiconductor applications.

In an embodiment, the chip attach medium comprises an adhesive material. In such an embodiment, the chip attach medium may serve as a mechanical interface between the electronic chip and the chip carrier.

In an embodiment, the chip attach medium comprises an electrically conductive material. In such an embodiment, the chip attach medium may serve as an electrical interface between the electronic chip and the chip carrier.

In an embodiment, the chip carrier comprises a leadframe. A leadframe may be a metal structure on and/or inside a chip package that is configured for carrying signals from the electronic chip to the outside, and/or vice versa.

The electronic chip inside the package or electronic component may be attached to the leadframe, and then bond wires may be provided for attaching pads of the electronic chip to leads of the leadframe. Subsequently, the leadframe may be moulded in a plastic case or any other encapsulant.

In an embodiment, the package comprises at least one electric contacting element, in particular at least one bond wire, electrically connecting the chip carrier with a main surface of the electronic chip opposing the chip attach medium. But taking this measure, an electric connection between the leadframe and an upper surface of the electronic chip, opposing the leadframe, can be established.

In an embodiment, the encapsulant comprises a laminate, in particular a printed circuit board laminate. In the context of the present application, the term "laminate structure" may particularly denote an integral flat member formed by electrically conductive structures and/or electrically insulating structures which may be connected to one another by applying a pressing force. The connection by pressing may be optionally accompanied by the supply of thermal energy. Lamination may hence be denoted as the technique of manufacturing a composite material in multiple layers. A laminate can be permanently assembled by heat and/or pressure and/or welding and/or adhesives.

In another embodiment, the encapsulant comprises a mold compound, in particular a plastic mold compound (e.g. comprising at least one of epoxy, Bismaleimide (BMI), cyanate ester, silicone, polyimide, combinations thereof, etc.). For instance, a correspondingly encapsulated chip may be provided by placing the electronic chip (if desired together with other components) between an upper mold die and a lower mold die and to inject liquid mold material therein. After solidification of the mold material, the package formed by the encapsulant with the electronic chip in between is completed. If desired, the mold may be filled with filler particles (e.g. $SiO_2$, $Al_2O_3$, BN, AlN, diamond, etc.) improving its properties, for instance its heat removal properties. Encapsulating may be accomplished, for example, by transfer molding or compression molding.

In an embodiment, the electronic chip is a power semiconductor chip. Such a power semiconductor chip may have integrated therein one or multiple integrated circuit elements such as transistors (for instance field effect transistors like metal oxide semiconductor field effect transistors and/or bipolar transistors such as insulated gate bipolar transistors) and/or diodes. Exemplary applications which can be provided by such integrated circuit elements are switching purposes. For example, such another integrated circuit element of a power semiconductor device may be integrated in a half-bridge or a full bridge. Exemplary applications are automotive applications.

In an embodiment, the package is configured as an embedded Wafer Level Ball Grid Array package (eWLB). This may involve the use of an artificial wafer formed of multiple separate semiconductor chips and an encapsulant.

The one or more electronic chips may comprise at least one of the group consisting of a diode, and a transistor, more particularly an insulated gate bipolar transistor. In an embodiment, the electronic device is configured as a power module. For instance, the one or more electronic chips may be used as semiconductor chips for power applications for instance in the automotive field. In an embodiment, at least one semiconductor chip may comprise a logic IC or a semiconductor chip for RF power applications. In one embodiment, the semiconductor chip(s) may be used as one or more sensors or actuators in microelectromechanical systems (MEMS), for example as pressure sensors or acceleration sensors.

As substrate or wafer for the electronic chips, a semiconductor substrate, preferably a silicon substrate may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 1 to FIG. 6 show different views of structures obtained during carrying out a method of manufacturing packages in a batch procedure according to an exemplary embodiment of the invention.

DETAILED DESCRIPTION OF EXEMPLARY EMBODIMENTS

Figure 7:
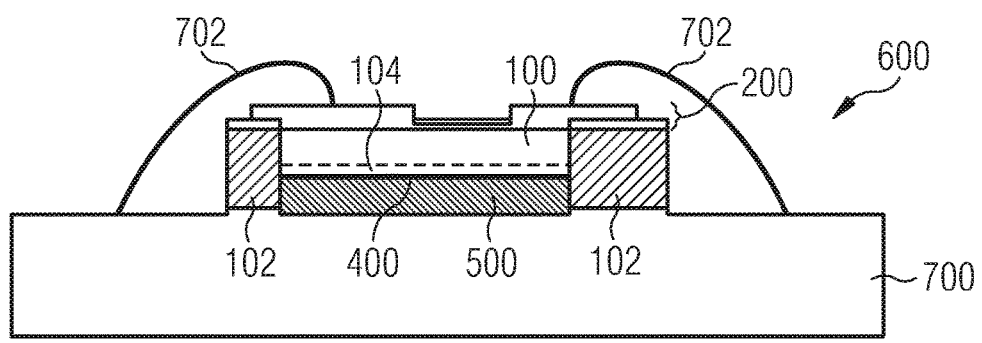
FIG. 7 shows a cross-sectional view of a package according to an exemplary embodiment of the invention manufactured in accordance with the principle of FIG. 1 to FIG. 6 and mounted on a chip carrier prior to encapsulation.

The illustration in the drawing is schematically and not to scale.

Before exemplary embodiments will be described in more detail referring to the figures, some general considerations will be summarized based on which exemplary embodiments have been developed.

According to an exemplary embodiment of the invention, a package with a post-applied chip attach medium is provided.

In particular with thin electronic chips, chip attachment to a chip carrier may be problematic. One risk in this context is a possible undesired upwards flow of chip attach medium, in particular when present in pasty consistence, to the upper surface of the electronic chip having the active region and corresponding wiring. A reason for this reliability issue is the fact that conventionally a chip attachment procedure is carried out at first so that it may happen that the chip attach paste flows upwardly along the lateral walls of the not yet encapsulated electronic chip up to the upper surface of the electronic chip. A further issue is handling of the tiny electronic chip during a pick and place procedure upon die attaching of thin electronic chips, since breakage of chips and hence mechanical damage may occur. Also sawing of semiconductor material with paste on the wafer may be difficult (breakout of semiconductor material may occur).

When the thickness of the electronic chips falls below about 100 μm, dispensing or printing of chip attach medium on a surface of a leadframe without cavities or via an adhesive film on the backside of the wafer may be also only applicable to a limited extent. With such a procedure, breakage of the electronic chips upon pick and place handling may occur when the electronic chips are thin and mechanically unstable. Significant inhomogeneity concerning the layer thicknesses may result in an inhomogeneity of the thermal and electric conductivity. This results in reliability issues. In particular with very thin chips, processing during dispensing of the chip attach paste is problematic, since adhesive paste or solder paste may flow upwardly on the chip edges (meniscus) up to the active upper chip surface. This may result in undesired short-circuiting of chip wiring by electrically conductive chip attach medium or more generally contamination of the active upper chip surface by chip attach medium.

According to an exemplary embodiment of the invention, an electronic chip is encapsulated first, i.e. before supplying the chip attach medium. If desired, the electronic chip may then be thinned from its backside up to a desired thickness, for example 50 μm. This thinning may be performed selectively, for example using a selective etching procedure. If desired, the encapsulant may be thinned as well (in particular beforehand). When a corresponding cavity or recess has been formed by the selective thinning of the electronic chip, the die attach medium may be inserted into the cavity, for instance by a printing procedure. Subsequently, the pre-encapsulated package may be mounted on a chip carrier, for instance a leadframe. This can be accomplished by tempering, whereby the die attach medium is cured, preferably in a press by the application of additional pressure.

According to such an embodiment, it is possible to package very thin electronic chips (for instance with a thickness of significantly less than 60 μm) on a chip carrier. This connection may be an electrically and/or thermally conductive connection. Upward flow of chip attach paste can therefore be efficiently suppressed or eliminated. Encapsulation before chip attachment simplifies handling, even when the thickness of the electronic chips or wafers is very small (for instance significantly below 50 μm). This procedure does not require sawing through semiconductor material and/or paste/adhesive material. Chip attach medium may be processed in a highly parallelized way, allowing for a batch manufacturing procedure of multiple packages at the same time. Application of chip attach medium by printing is possible (preferably screen printing). Very homogeneous thicknesses can be obtained. Also the encapsulant can be coupled via a complete connection layer to the chip carrier (in particular, adherence by adhesive may be larger than adherence by press mass).

A gist of an exemplary embodiment is the provision of a pre-encapsulated electronic chip in which the partially encapsulated and thinned chips are fixed with a die attach medium on the chip carrier. It is furthermore possible that the die attach medium is applied via a cavity of the encapsulant directly into the cavity on the backside of the semiconductor chip. It is possible to connect the full surface of the pre-encapsulated electronic chip to the chip carrier. Encapsulation can be carried out on wafer level of the already patterned or singularized semiconductor wafer.

FIG. 1 to FIG. 6 show different views of structures obtained during carrying out a method of manufacturing packages 600 in a batch procedure according to an exemplary embodiment of the invention.

In order to obtain a structure shown in FIG. 1, a plurality of electronic chips 100 are placed on a temporary carrier 110 covered with an adhesive layer 112 (such as a tape or foil). The temporary carrier 110 may be made, for example, of glass or metal or ceramic material and provides mechanical stability. The adhesive layer 112 adheres the electronic chips 100 on the temporary carrier 110 and can be thermally released, as described below. Thereafter, the placed electronic chips 100 are encapsulated in a batch procedure by an encapsulant 102 such as a mold compound (for example a thermoset, like an epoxy, or a high performance thermoplastic material) or a laminate (for instance made of several interconnected foils). Preferably, the mold compound is highly filled, e.g. more than 50 vol %, with particles like silicon dioxide or other inorganic particles. The encapsulant 102 is applied and cured (preferably only partially, although a complete curing is possible) so as to obtain a robust integral structure. By taking this measure, an artificial wafer (or recon die) of individual electronic chips 100 embedded in a matrix of encapsulant 102 is obtained. The electronic chips 100 are power semiconductor chip having chip pads 114 on an active region 104 facing the temporary carrier 110 rather than the encapsulant 102.

In order to obtain a structure shown in FIG. 2, the body composed of the electronic chips 100 with their chip pads 114 on their active regions 104 encapsulated by the encapsulant 102 is released from the temporary carrier 110 with the adhesive layer 112 by raising the temperature so that the adhesive layer 112 loses its adhesive property. The body may then be turned upside down (for instance may be rotated by 180°). Subsequently, a redistribution layer 200 (composed of electrically conductive structures 202 in a dielectric matrix 204) can be formed on the chip pads 114 to translate between the small dimensions of semiconductor technology (i.e. the electronic chips 100) and the larger dimensions of mounting base technology (for example printed circuit board technology).

In order to obtain a structure shown in FIG. 3, part of the encapsulant 102 is removed (for instance by grinding) so as to expose a main surface of the electronic chips 100 towards an environment. After that, the electronic chips 100 are thinned by selective etching of semiconductor material with regard to the material of the encapsulant 102. The thinning may be performed up to a desired thickness, D, of the thinned electronic chip 100, for instance 10 µm. Due to the previous encapsulation, handling of tiny electronic chips 100 is significantly simplified. Consequently, a plurality of cavities 300 with a deepness, d, in a range between 5 µm and 60 µm (for example 20 µm) is obtained. As a result, a structure is obtained in which the encapsulant 102 encapsulates part of the electronic chip 100 so that the cavities 300 are delimited between a surface of a respective one of the electronic chips 100 and a respective surface portion of the encapsulant 102.

In order to obtain a structure shown in FIG. 4, a backside metallization 400 is formed, for example by sputtering, on exposed surface regions of the thinned electronic chips 100 in the cavities 300. As a result, the electronic chips 100 have their backside metallization 400 at the first main surface opposing the respective active region 104 at the second main surface. The provision of the backside metallization 400 is in particular advantageous for packages 600 with a vertical (according to the vertical axis according to FIG. 4) current flow (as occurs with power semiconductors).

In order to obtain a structure shown in FIG. 5, a pasty chip attach medium 500 is printed exclusively in each of the cavities 300. The chip attach medium 500 consequently covers a respective part of the backside of each of the electronic chips 100 and sidewalls of the respective surface portions of the encapsulant 102. In contrast to this, horizontal surfaces of the encapsulant 102 remain free of the chip attach medium 500. The chip attach medium 500 can be a paste of an adhesive and/or electrically conductive material which can be applied by screen printing, glue printing, glue dispensing, coating with coating knife, etc. At this processing stage, the chip attach medium 500 may be partly cured or hardened in order to remove solvents and to prepare the paste material of the chip attach medium 500 to assume a stable shape (for instance B-stage paste material). In this context, silver or copper paste may be used. Connection may be accomplished by sintering (pressureless or with pressure), soldering, etc.

As a result, a wafer-level multi-package preform 502 according to an exemplary embodiment of the invention is obtained. The preform 502 comprises the electronic chips 100 embedded in the encapsulant 102 and being covered with distinguished sections of the chip attach medium 500 forming separate unconnected islands. Each of the electronic chips 100 comprises a first main surface facing the chip attach medium 500 and an opposing second main surface comprising the active region 104 of the respective electronic chip 100.

In order to obtain the packages 600 according to an exemplary embodiment shown in FIG. 6, the preform 502 with the encapsulated electronic chips 100 is placed on a chip carrier 602 (such as a leadframe, a printed circuit board, a ceramic carrier, a plastic carrier, a glass carrier, etc.) via the chip attach medium 500. The so obtained structure is then separated at separation lines 610 (for instance by sawing) into the shown plurality of packages 600. Each of the packages 600 comprises one (or more) of the electronic chips 100, part of the encapsulant 102, part of the chip attach medium 500, and part of the chip carrier 602. A first main surface of each of the electronic chips 100 is covered by the chip attach medium 500. An opposing second main surface of each of the electronic chips 100 faces the respective redistribution layer 200 of the package 600.

Preferably, the encapsulant 102 has been cured only partially according to FIG. 1 and/or the chip attach medium 500 has been cured only partially according to FIG. 5. In such a scenario, the curing may be completed (for instance in a heated press) only at the processing state according to FIG. 6 so that preferably both the material of the encapsulant 102 and the material of the chip attach medium 500 contribute to the formation of a connection with the chip carrier 602. Hence, the curing of the chip attach medium 500 and of the encapsulant 102 may be completed after the attaching by increasing temperature and/or increasing pressure.

FIG. 7 shows a cross-sectional view of a package 600 according to an exemplary embodiment of the invention manufactured in accordance with the general scheme according to FIG. 1 to FIG. 6 and mounted on a chip carrier 700 (such as a leadframe, a printed circuit board (PCB), a ceramic carrier, an interposer, a DCB (Direct Copper Bonded substrate), an insulated metal substrate (IMS), etc.). In contrast to the chip carrier 602 used according to FIG. 6, the chip carrier 700 used according to FIG. 7 is an already structure leadframe. After pre-curing the paste (constituting the chip attach medium 500), one of the sections according to FIG. 5 and FIG. 6 later forming a package 600 is mounted on the chip carrier 700. The package 600 shown in FIG. 7 comprises electric contacting elements 702, which are here embodied as bond wires, for electrically connecting the chip carrier 700 with the redistribution layer 200 on an upper main surface of the electronic chip 100 opposing the chip attach medium 500. The wire bond procedure in FIG. 7 is optional, alternative technologies can be implemented as well for realizing electric contacting elements 702 (such as involving a clip, wherein attachment may be made by sintering, soldering, gluing or other interconnect technologies)

Figure 8:
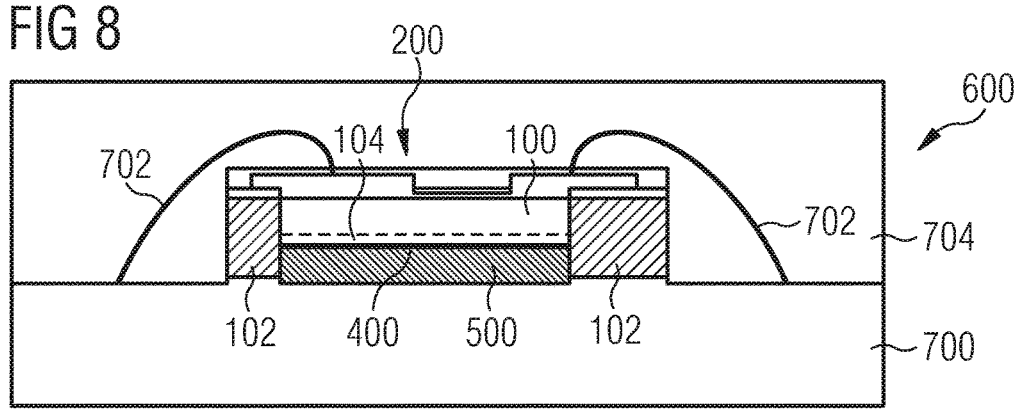
FIG. 8 shows a cross-sectional view of the package according to FIG. 7 after encapsulation.

FIG. 8 shows a cross-sectional view of the package 600 according to FIG. 7 after additional encapsulation, by an additional encapsulant 704, of an upper surface of the chip carrier 700, the electric contacting elements 702, the encapsulant 102 and the redistribution layer 200 with the electronic chip 100 and the chip attach medium 500 embedded therein.

Figure 9:
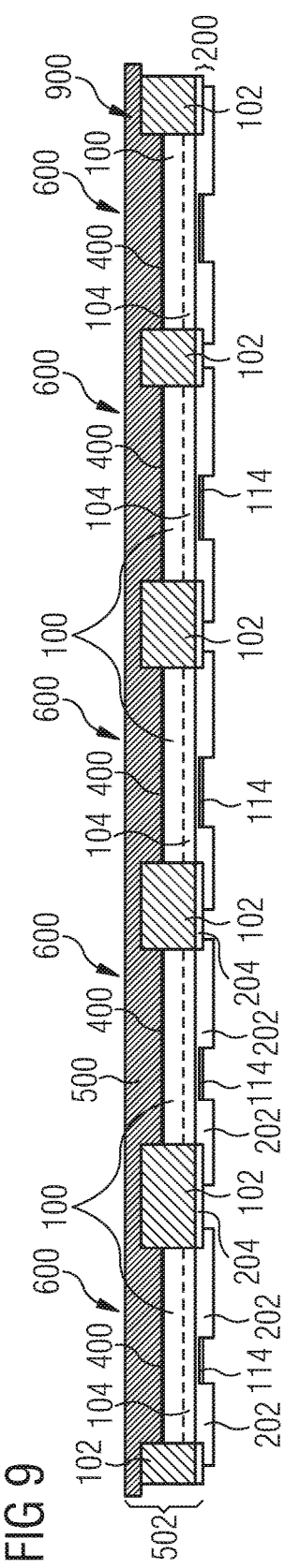
FIG. 9 to FIG. 11 show cross-sectional views of multi-package preforms obtained during carrying out a method of manufacturing packages in a batch procedure according to other exemplary embodiments of the invention.
Figure 10:
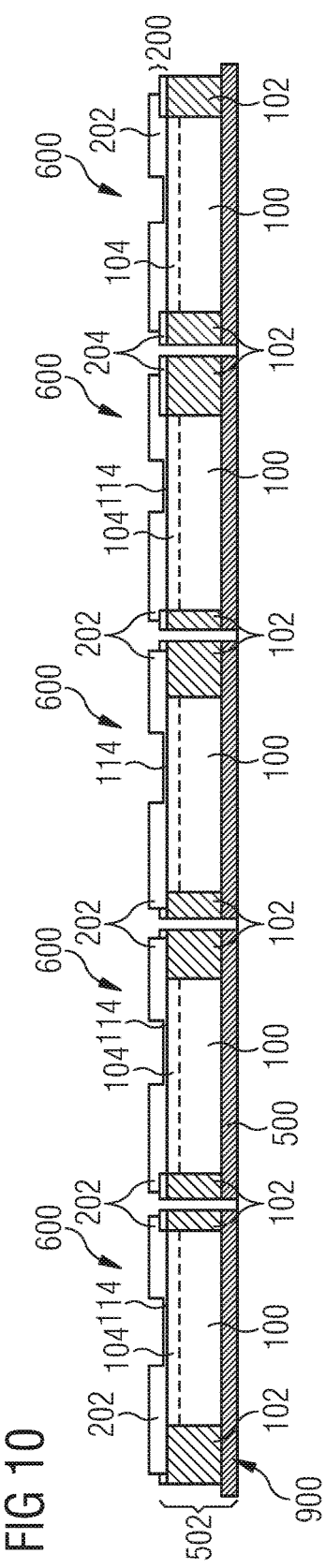
Figure 11:
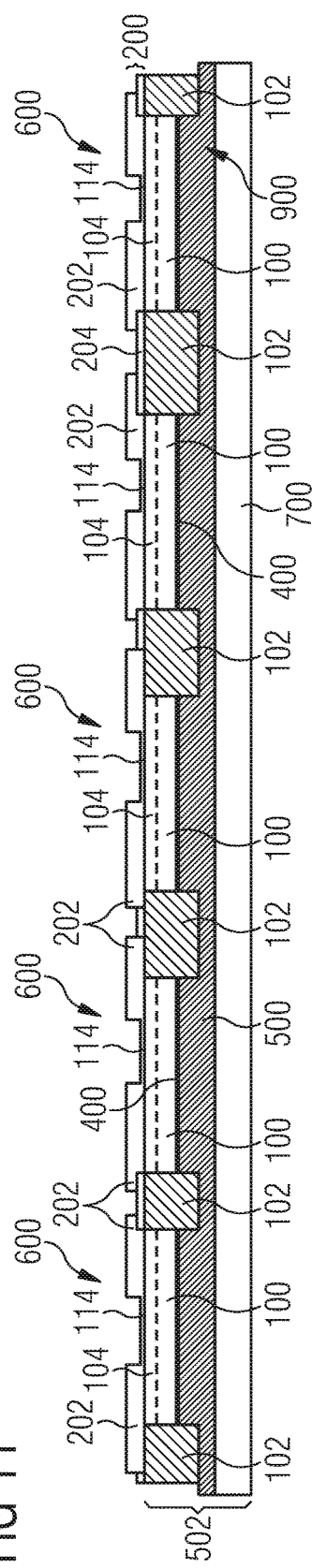

FIG. 9 to FIG. 11 show cross-sectional views of wafer-level multi-package preforms 502 obtained during carrying out a method of manufacturing packages 600 in a batch procedure according to another exemplary embodiment of the invention.

FIG. 9 shows a wafer-level multi-package preform 502 according to an exemplary embodiment of the invention. The preform 502 comprises electronic chips 100 embedded in an encapsulant 102 and being covered with a continuous chip attach layer 900 forming an uninterrupted structure with connected portions on each backside surface of the electronic chips 100 (covered with backside metallization 400) and on the intermediate exposed surface portions of the encapsulant 102. Each of the electronic chips 100 comprises a first main surface facing a respective portion of the chip attach layer 900 and an opposing second main surface comprising the active region 104 and the redistribution layer 200 of the respective electronic chip 100 for connection to an electronic periphery device (such as a PCB). In other words, the chip attach layer 900 covers a surface of the plurality of electronic chips 100 and covers surface portions of the encapsulant 102 between the electronic chips 100. Apart from this difference, the preform 500 according to FIG. 9 corresponds to the preform 502 according to FIG. 5. The embodiment according to FIG. 9 has the advantage that the adhesive constituting the chip attach layer 900 later on connects not only the electronic chips 100 with a respective chip carrier 600, 702 but additionally also exposed surface portions of the encapsulant 102 with the chip carrier 600, 702. In view of the presence of cavities 300 above the electronic chip 102, the chip attach layer 900 has an uneven thickness which is higher in the regions above the electronic chips 100 than in the regions above portions of the encapsulant 102. In the embodiment of FIG. 9, already at a state of the manufacturing procedure corresponding to FIG. 1, the encapsulant 102 may be completely cured or hardened since it is not necessary according to FIG. 9 that also the material of the encapsulant 102 contributes to a connection force with the chip carrier 600, 702. This means that the already fully cured encapsulant 102 in the state of the manufacturing procedure according to FIG. 1 provides a high degree of mechanical stability when fulfilling its function of supporting the electronic chips 100, thereby simplifying their handling.

Thus, according to FIG. 9, for a simultaneous stable connection of the material of the encapsulant 102 to the chip carrier 600, 702, not only cavities 300 behind the chip backside are filled with pasty chip attach material, but also the material of the encapsulant 102 is covered therewith (which is advantageous in particular in an embodiment of an adhesive paste). This ensures an uninterrupted reliable connection to the chip carrier 600, 702, which is further promoted by the fact that the surface adhesion of adhesive material is in many cases higher than that of material of the encapsulant 102. Hence, the preform 502 can be fully covered with material of the chip attach medium 500 on the backside, i.e. on the main surface of the preform 502 opposing the redistribution layer 200 on the chip pads 114 on the active regions 104.

In order to obtain wafer-level multi-package preform 502 shown in FIG. 10, no cavities 300 are formed between electronic chips 100 and encapsulant 102 so that chip attach layer 900 has the same thickness on portions of the encapsulant 102 and on the electronic chips 100. Hence, according to FIG. 10, the adhesive constituting the chip attach medium 500 is applied completely on the backside of the electronic chips 100 and the encapsulant 102 without previously forming cavities 300 by partially removing semiconductor material from the backside of the electronic chips 100. Hence, FIG. 10 corresponds to an architecture involving die attach without cavity formation.

In order to obtain wafer-level multi-package preform 502 shown in FIG. 11, the wafer-level multi-package preform 502 according to FIG. 9 is equipped with electrically conductive chip attach medium 500. A current or a voltage is applied to the electrically conductive chip attach medium 500 for galvanically growing the chip carrier 700 on an exposed surface of the chip attach medium 500. Thus, the electrically conductive adhesive layer constituting the chip attach layer 900 is used as a seed layer for galvanically depositing the chip carrier 700. In such an embodiment, a cavity 300 may be omitted.

According to each of FIG. 9 to FIG. 11, the respective wafer-level multi-package preform 502 needs to be singularized (for instance in a manner as shown in FIG. 6) for separating the respective wafer-level multi-package preform 502 into a plurality of individual packages 600.

Figure 12:
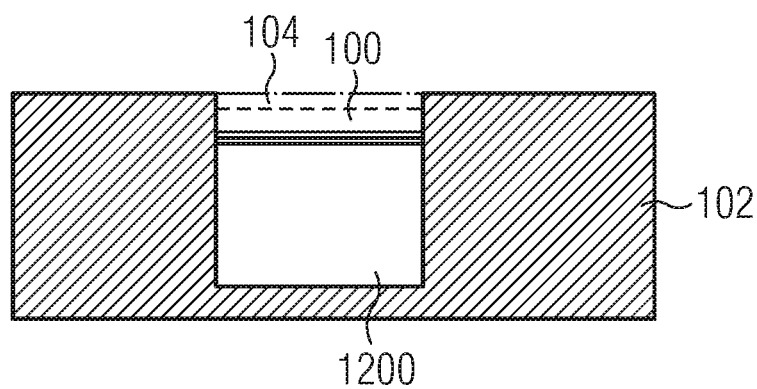
FIG. 12 to FIG. 14 show different views of structures obtained during carrying out a method of manufacturing a package according to an exemplary embodiment of the invention.
Figure 13:
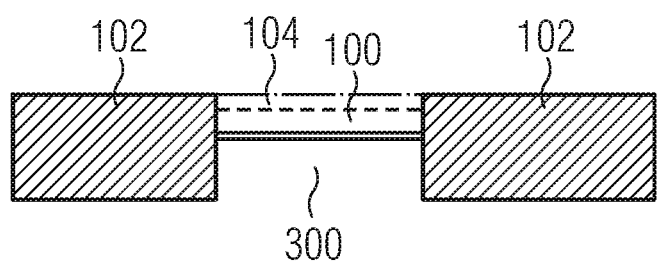
Figure 14:
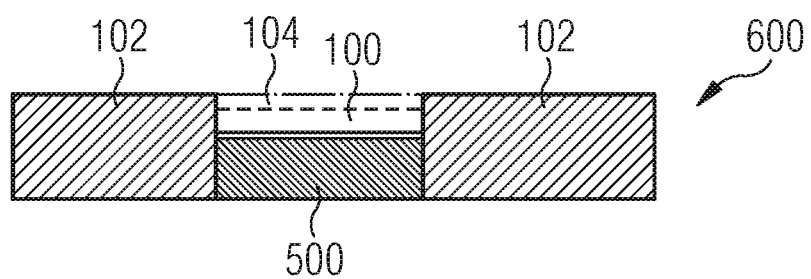

FIG. 12 to FIG. 14 show different views of structures obtained during carrying out a method of manufacturing a package 600 according to an exemplary embodiment of the invention.

In order to obtain a structure shown in FIG. 12, the electronic chip 100 is arranged on and is thereby connected with a dummy body 1200, which is here embodied as a sacrificial glass carrier, so that the active region 104 of the electronic chip 100 opposes the dummy body 1200. Subsequently, the arrangement composed of the dummy body 1200 and the electronic chip 100 mounted thereon is encapsulated in an encapsulant 102 so that the active region 104 remains exposed In order to obtain a structure shown in FIG. 13, material of the encapsulant 102 is removed (for instance by grinding or etching) from a side opposing the active region 104 to thereby expose a lower main surface of the dummy body 1200. Thereafter, the dummy body 1200 is removed by a selective etching procedure. By removing the dummy body 1200 after the encapsulating, cavity 300 is formed.

In order to obtain a structure shown in FIG. 14, the cavity 300 is filled with chip attach medium 500, for instance by printing adhesive material therein.

Although not shown in the figures, the manufacturing procedure according to FIG. 12 to FIG. 14 may also be carried out for forming a plurality of packages 600 as a batch (as shown for instance according to FIG. 1 to FIG. 6). A corresponding wafer-level multiple-package preform 502 may then be singularized by sawing solely through the material of the encapsulant 102. A redistribution layer 200 is dispensable according to FIG. 12 to FIG. 14. The procedure described referring to FIG. 12 to FIG. 14 may be carried out in accordance with an eWLB (embedded Wafer Level Ball Grid Array) architecture.

FIG. 15 to FIG. 18 show different views of structures obtained during carrying out a method of manufacturing packages 600 in a batch procedure according to still another exemplary embodiment of the invention.

Figure 15:
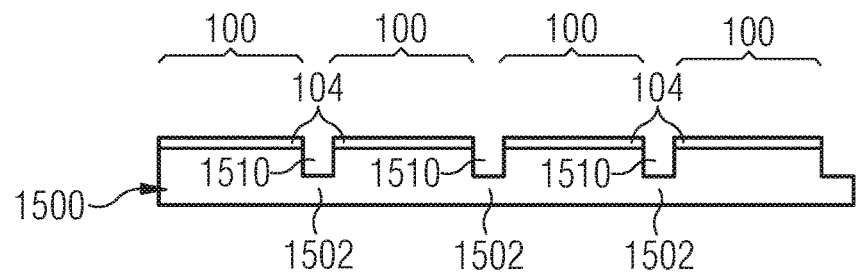
FIG. 15 to FIG. 18 show different views of structures obtained during carrying out a method of manufacturing packages in a batch procedure according to still another exemplary embodiment of the invention.

In order to obtain a structure shown in FIG. 15, an integral semiconductor wafer 1500 is processed for forming webs 1502 as predetermined break points in a subsequent singularization procedure. Hence, multiple electronic chips 100 are configured as sections of a common semiconductor wafer 1500 with thinned semiconductor webs 1502 in between. In order to obtain a structure shown in FIG. 16, an upper surface of the structure shown in FIG. 15 is encapsulated with an encapsulant 102. By taking this measure, the active regions 104 of the electronic chips 100 as well as recesses 1510 above the webs 1502 and between the electronic chips 100 are filled with material of the encapsulant 102.

Figure 16:
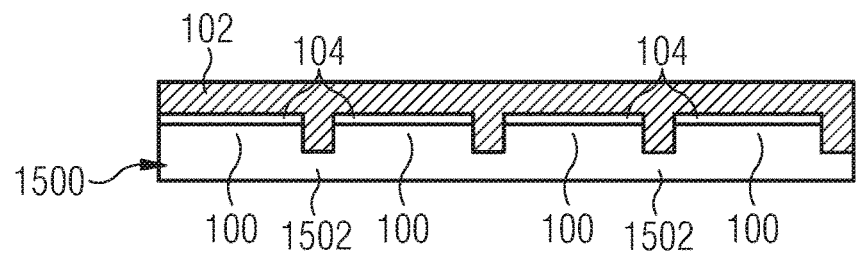
Figure 17:
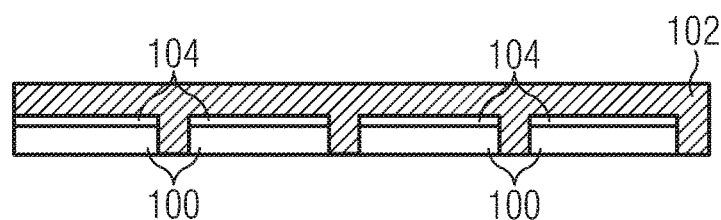

In order to obtain a structure shown in FIG. 17, the structure shown in FIG. 16 is thinned from a bottom side to thereby remove material of the wafer 1500. This may be accomplished by etching or grinding. As a result, the electronic chips 100 are separated from one another at the previous positions of the webs 1502. It is also possible in the present embodiment to apply a damage etch and/or a patterned etch (cavity 300).

Figure 18:
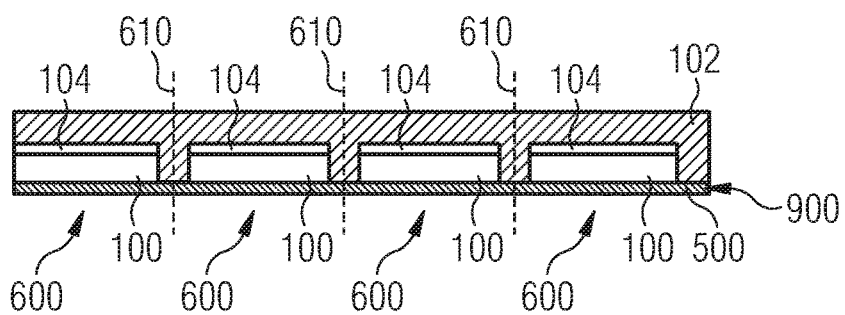

In order to obtain a structure shown in FIG. 18, a chip attach layer 900 with homogeneous thickness is applied to a lower main surface of the structure shown in FIG. 17 thereby covering the lower main surfaces of the electronic chips 100 as well as exposed surfaces of the encapsulant 102.

Subsequently, the so obtained wafer-level multi-package preform 502 may be singularized by cutting, sawing or etching along separation lines 610. Alternatively, the chip attach layer 900 may also be patterned or divided into a plurality of separate sections.

According to FIG. 15 to FIG. 18, encapsulation is already carried out on wafer level of an already patterned semiconductor wafer by etching. The final separation of the processed semiconductor wafer occurs by thinning (for instance by grinding) from a backside of the wafer. The adhesive material is applied on these pre-encapsulated elements from a backside.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a package, the method comprising:
   encapsulating at least part of an electronic chip by an encapsulant;
   subsequently covering a part of the electronic chip with a chip attach medium;
   attaching the encapsulated electronic chip on a chip carrier via the chip attach medium;
   curing the chip attach medium after the attaching,
   wherein the encapsulant encapsulates part of the electronic chip so that a cavity is delimited between a surface of the electronic chip and a surface of the encapsulant, wherein the chip attach medium is located in the cavity, in particular exclusively in the cavity.

2. The method according to claim 1, wherein the method further comprises thinning the electronic chip, in particular after the encapsulating, more particularly for forming a cavity delimited between a surface of the electronic chip and a surface of the encapsulant.

3. The method according to claim 2, wherein the method further comprises removing part of the encapsulant before the thinning, in particular for exposing a surface of the electronic chip.

4. The method according to claim 1, wherein the method further comprises:
   encapsulating at least part of at least one further electronic chip by the same encapsulant during encapsulating the electronic chip;
   subsequently covering a part of the at least one further electronic chip with the chip attach medium;
   attaching the encapsulated at least one further electronic chip on the chip carrier via the chip attach medium.

5. The method according to claim 4, wherein the method further comprises separating an obtained structure into a plurality of packages each comprising at least one of the electronic chips, part of the encapsulant, part of the chip attach medium, and part of the chip carrier.

6. The method according to claim 4, wherein the electronic chip and the at least one further electronic chip are sections of a common semiconductor wafer with thinned semiconductor webs in between, and wherein the electronic chips are separated from one another after the encapsulating.

7. The method according to claim 1, wherein the electronic chip comprises a first main surface facing the chip attach medium and an opposing second main surface comprising an active region of the electronic chip.

8. The method according to claim 1, wherein the chip attach medium is cured by at least one of increasing temperature and increasing pressure.

9. The method according to claim 1, wherein the method comprises growing, in particular galvanically growing, the chip carrier directly on the chip attach medium.

10. The method according to claim 1, wherein the method comprises forming the cavity by arranging the electronic chip on a dummy body prior to the encapsulating and removing the dummy body after the encapsulating.

11. The method according to claim 1, wherein the encapsulant is only partially cured upon encapsulating, and is completely cured during or after attaching the encapsulated electronic chip on a chip carrier.

12. A package, comprising:
    an electronic chip;
    an encapsulant encapsulating part of the electronic chip so that a cavity is delimited between the surface of the electronic chip and a surface of the encapsulant;
    a chip attach medium in the cavity;
    wherein the electronic chip has a first main surface facing the chip attach medium and has an opposing second main surface facing a redistribution layer of the package, wherein the electronic chip has a backside metallization at the first main surface and has an active region at the second main surface.

13. The package according to claim 12, comprising a chip carrier on which the encapsulated electronic chip is attached via the chip attach medium.

14. The package according to claim 12, wherein the electronic chip has a thickness in a range between 5µm and 150µm, in particular between 20µm and 60µm.

15. The package according to claim 12, wherein the electronic chip is a power semiconductor chip.

16. The package according to claim 13, comprising at least one electric contacting element, in particular at least one bond wire, electrically connecting the chip carrier with a main surface of the electronic chip opposing the chip attach medium.

* * * * *